(12) United States Patent
Matsushita et al.

(10) Patent No.: US 9,023,172 B2
(45) Date of Patent: May 5, 2015

(54) METHOD OF MANUFACTURING LAMINATE

(71) Applicant: Tokyo Ohka Kogyo Co., Ltd., Kawasaki-shi (JP)

(72) Inventors: Atsushi Matsushita, Kawasaki (JP); Tatsuhiro Mitake, Kawasaki (JP)

(73) Assignee: Tokyo Ohka Kogyo Co., Ltd, Kawasaki-shi (JP)

( * ) Notice: Subject to any disclaimer, the term of this patent is extended or adjusted under 35 U.S.C. 154(b) by 0 days.

(21) Appl. No.: 14/377,140

(22) PCT Filed: Feb. 5, 2013

(86) PCT No.: PCT/JP2013/052536
§ 371 (c)(1),
(2) Date: Aug. 6, 2014

(87) PCT Pub. No.: WO2013/118694
PCT Pub. Date: Aug. 15, 2013

(65) Prior Publication Data
US 2015/0000834 A1   Jan. 1, 2015

(30) Foreign Application Priority Data

Feb. 8, 2012   (JP) .................. 2012-025379

(51) Int. Cl.
*B32B 38/00* (2006.01)
*H01L 21/268* (2006.01)

(52) U.S. Cl.
CPC .......... *B32B 38/0008* (2013.01); *H01L 21/268* (2013.01); *B32B 2310/14* (2013.01)

(58) Field of Classification Search
CPC ............ B32B 38/0008; B32B 2310/14; H01L 21/268
USPC ............................................ 156/272.2, 272.6
See application file for complete search history.

(56) References Cited

U.S. PATENT DOCUMENTS

| | | |
|---|---|---|
| 2005/0233547 A1 | 10/2005 | Noda et al. |
| 2009/0111237 A1 | 4/2009 | Akiyama et al. |
| 2009/0133812 A1 | 5/2009 | Noda et al. |
| 2010/0038035 A1 | 2/2010 | Noda et al. |
| 2010/0041211 A1 | 2/2010 | Noda et al. |
| 2010/0186883 A1 | 7/2010 | Tomoda |
| 2011/0151176 A1 | 6/2011 | Akiyama et al. |
| 2011/0297771 A1 | 12/2011 | Noda et al. |

FOREIGN PATENT DOCUMENTS

| | | |
|---|---|---|
| JP | 2004-64040 | 2/2004 |
| JP | 2004-253483 | 9/2004 |

(Continued)

OTHER PUBLICATIONS

International Search Report in International Application No. PCT/JP2013/052536 dated May 14, 2013.

*Primary Examiner* — Daniel McNally
(74) *Attorney, Agent, or Firm* — Knobbe Martens Olson & Bear, LLP

(57) ABSTRACT

A method of manufacturing a laminate including a substrate, a support, and a release layer, the method including a preliminary treatment process of increasing temperatures of the support carried into a reaction chamber and the inside of the reaction chamber by a plasma treatment, and a release layer forming process of supplying a source gas serving as the release layer into the reaction chamber after the preliminary treatment process to form the release layer on the support.

18 Claims, 4 Drawing Sheets

(56) References Cited

FOREIGN PATENT DOCUMENTS

| JP | 2005183689 A | * | 7/2005 |
| JP | 2009-064831 | | 3/2009 |
| JP | 2009-105315 | | 5/2009 |
| JP | 2010-177390 | | 8/2010 |
| TW | 200924978 | | 6/2009 |
| TW | 201017743 | | 5/2010 |
| WO | WO 2009/072170 | | 6/2009 |

* cited by examiner

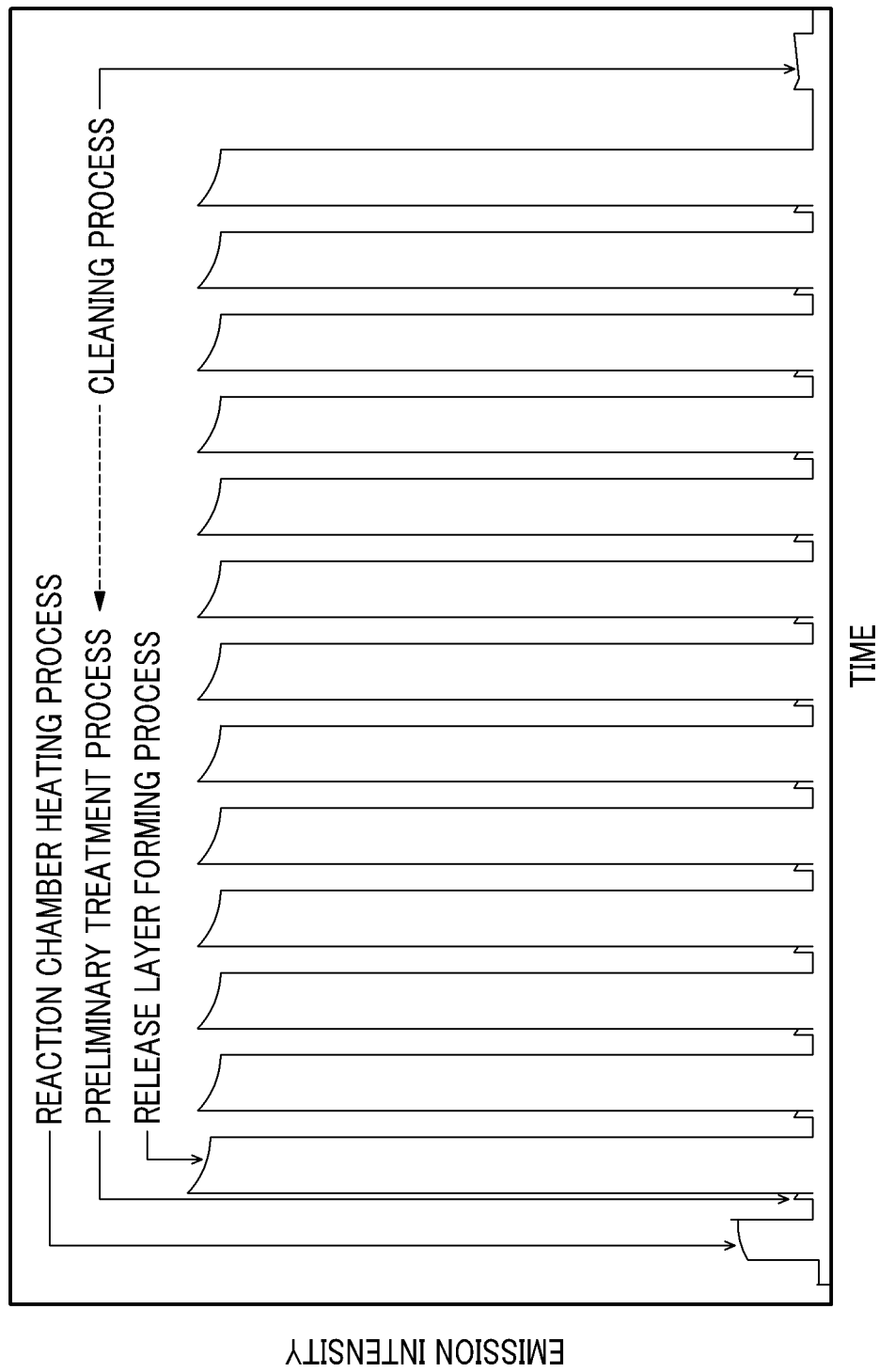

METHOD OF MANUFACTURING LAMINATE

This application is the U.S. National Phase under 35 U.S.C. §371 of International Application No. PCT/JP2013/052536, filed Feb. 5, 2013, designating the U.S., and published in Japanese as WO 2013/118694 on Aug. 15, 2013, which claims priority to Japanese Patent Application No. 2012-025379, filed Feb. 8, 2012, the entire content of which is incorporated herein by reference.

TECHNICAL FIELD

The present invention relates to a method of manufacturing a laminate, and more particularly, to a method of manufacturing a laminate including a substrate, a support, and a release layer.

BACKGROUND ART

With high functionality of mobile phones, digital AV equipment, IC cards, and the like, there is an increasing demand for high integration of silicon into a package due to decreases in size and thickness of a semiconductor silicon chip (hereinafter, chip) to be mounted. For example, a decrease in thickness is required in an integrated circuit, as typified by a chip size package (CSP) or a multi-chip package (MCP), in which a plurality of chips are formed into one package. In order to realize the high integration of chips into the package, it is necessary to decrease the thickness of the chip up to a range of 25 µm to 150 µm.

However, since a semiconductor wafer (hereinafter, wafer) serving as a base of a chip is thinned by grinding, the strength thereof is decreased, and thus there is a tendency for a crack or a warp to occur. In addition, since it is difficult to automatically transport the wafer of which the strength is decreased due to the thinning, the transportation has to be performed manually, which makes the handling thereof troublesome.

For this reason, a wafer handling system has been developed which bonds a plate-shaped member, referred to as a support plate, which is formed of glass, silicon, rigid plastic, or the like, to a wafer to be ground to supplement the strength of the wafer and which prevents a crack and a warp from appearing on the wafer. Since the strength of the wafer is supplemented by such a wafer handling system, it is possible to automate the transportation of the thinned wafer.

In the above-described wafer handling system, the support plate is bonded (temporarily fixed) to the wafer using various thermoplastic resins, adhesives, and the like. After the wafer having the support plate bonded thereto is thinned, the support plate is released from the wafer before dicing the wafer.

PTL 1 discloses a technique of suitably performing the temporary fixation and release of a support plate with respect to a wafer. In the technique disclosed in PTL 1, a laminate is used which includes a substrate to be ground, a bonding layer coming into contact with the substrate to be ground, a photothermal conversion layer including a light absorbent and a heat-decomposable resin, and a light-transmitting support, the photothermal conversion layer being decomposed when the irradiation with radiant energy is performed after the surface of the substrate to be ground on the opposite side to the bonding layer is ground, to thereby release the ground substrate and the light-transmitting support from each other. When the support plate (support) is temporarily fixed to the wafer (substrate) using the laminate, the photothermal conversion layer is irradiated with light, and thus it is possible to easily release the wafer and the support plate from each other.

CITATION LIST

Patent Literature

[PTL 1] JP-A-2004-64040 (published on Feb. 26, 2004)

SUMMARY OF INVENTION

Technical Problem

However, in the technique disclosed in PTL 1, since the photothermal conversion layer is formed by spin coating, it takes time to form the photothermal conversion layer, and there are problems such as running costs and effluent. For this reason, it is highly beneficial to provide a technique capable of more suitably manufacturing the above-described laminate.

The present invention is contrived in view of the above-described situations, and a main object thereof is to provide a technique for suitably manufacturing a laminate for temporarily fixing a support to a substrate.

Solution to Problem

A method of manufacturing a laminate according to the present invention is a method of manufacturing a laminate which includes a substrate, a light-transmitting support that supports the substrate, and a release layer which is provided between the substrate and the support and is configured to be transformed by absorbing light with which irradiation is performed through the support, the method including a preliminary treatment process of increasing temperatures of the support carried into a reaction chamber and the inside of the reaction chamber by a plasma treatment; and a release layer forming process of supplying a source gas serving as the release layer into the reaction chamber after the preliminary treatment process to form the release layer on the support.

Advantageous Effects of Invention

According to the present invention, it is possible to suitably manufacture a laminate, including a release layer, for temporarily fixing a support to a substrate by performing a preliminary treatment process of increasing temperatures of the support and the inside of a reaction chamber before a release layer forming process of forming the release layer.

BRIEF DESCRIPTION OF DRAWINGS

FIG. 4 is a graph showing emission intensity of a plasma when forming a release layer according to an embodiment of the present invention.

DESCRIPTION OF EMBODIMENTS

The present invention provides a method of manufacturing a laminate. The laminate manufactured by the manufacturing method according to the present invention is useful as a structure for temporarily fixing a substrate to a support, and the use thereof is not particularly limited. However, for example, in a wafer support system, the laminate can be suitably used in a substrate processing method in which a semiconductor wafer (substrate) is temporarily fixed to a support plate (support) and thinning, back wiring, and the like are performed.

Regarding the method of manufacturing a laminate, the inventors have examined the formation of a release layer of the laminate by a plasma chemical vapor deposition (CVD) method on the basis of their own ideas. Here, in order to mass-produce satisfactory release layers by a plasma CVD method, it is preferable that discharge for each time have no variation and be uniform. As a result of earnest examination, the inventors have found that it is possible to maintain a constant temperature inside a reaction chamber in a release layer forming process and to realize uniform discharge by performing a preliminary treatment process of increasing temperatures of a support and the inside of the reaction chamber before performing the release layer forming process of forming the release layer by a plasma CVD method, and have completed the present invention.

Figure 1:
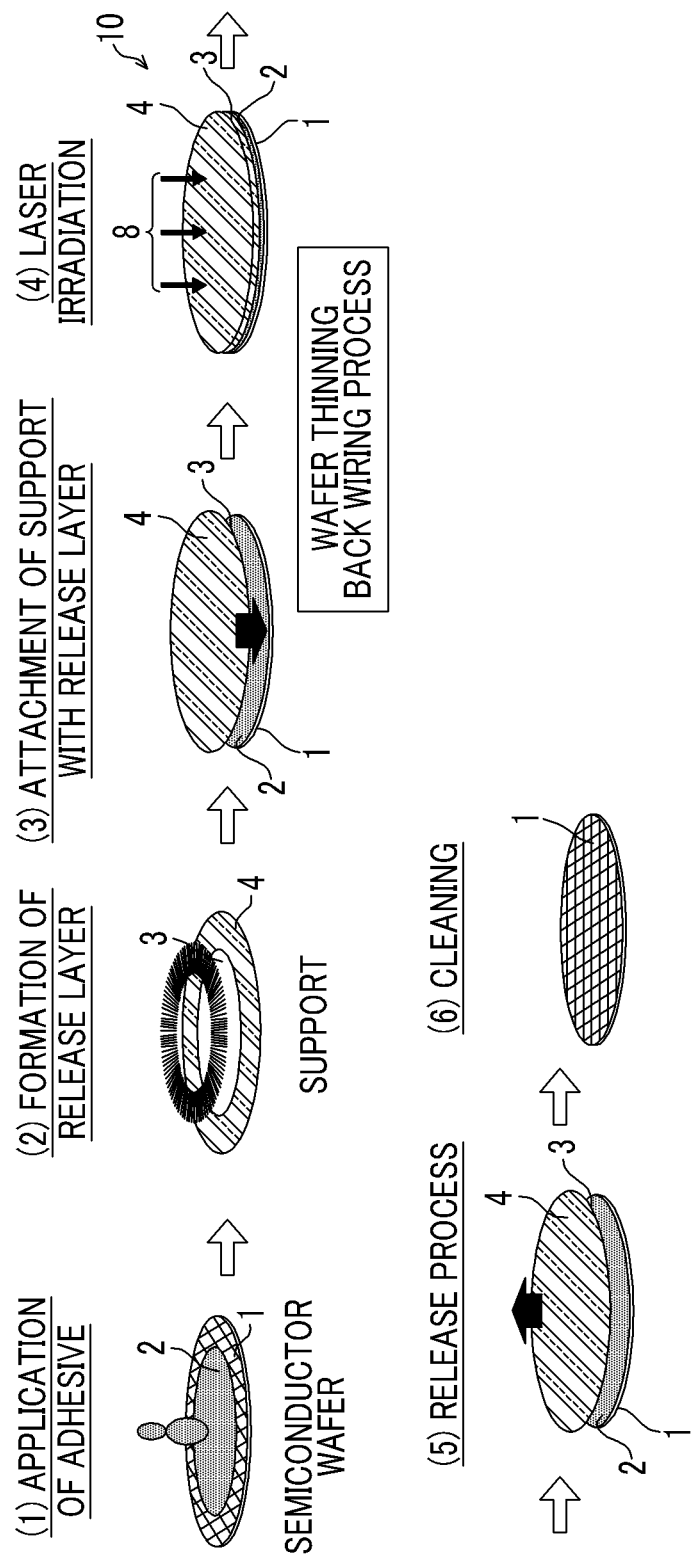
FIG. 1 is a diagram illustrating outlines of a method of manufacturing a laminate according to an embodiment of the present invention and a method of releasing the laminate manufactured by the manufacturing method.
Figure 2:
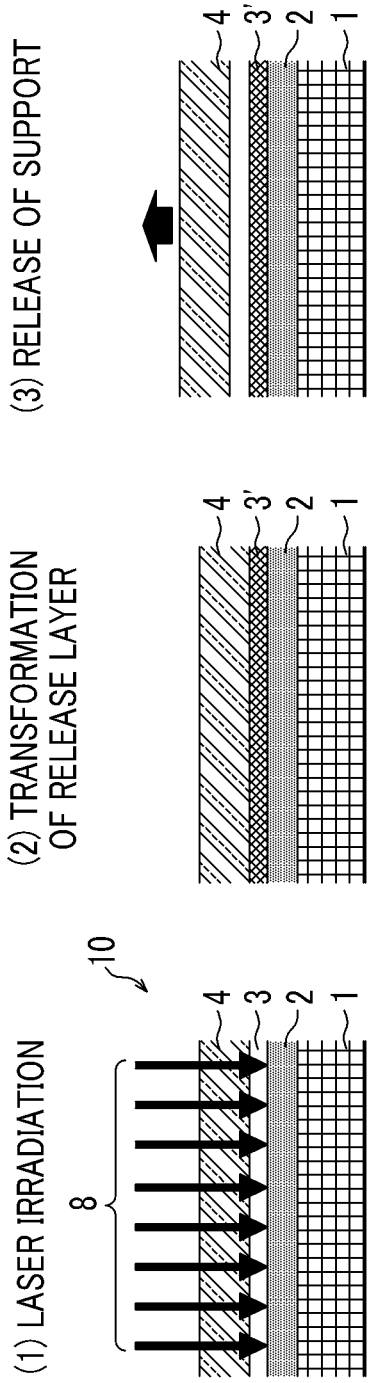
FIG. 2 is a diagram illustrating an outline of a method of releasing a laminate manufactured by a method of manufacturing a laminate according to an embodiment of the present invention.

FIG. 1 is a diagram illustrating outlines of a method of manufacturing a laminate according to an embodiment of the present invention and a method of releasing the laminate manufactured by the manufacturing method. In addition, FIG. 2 is a diagram illustrating an outline of a method of releasing a laminate manufactured by a method of manufacturing a laminate according to an embodiment of the present invention.

As shown in (1) to (3) of FIG. 1, according to an method of manufacturing a laminate according to an embodiment of the present invention, it is possible to manufacture a laminate 10 by applying an adhesive 2 to a substrate (semiconductor wafer) 1, forming a release layer 3 on a support 4, and bonding the support 4 with the release layer 3 to the substrate 1 through the adhesive 2. Meanwhile, the application of the adhesive and the formation of the release layer may be performed sequentially regardless of order or in parallel. In addition, when the release layer 3 has an adhesive property, the support 4 with the release layer 3 may be directly attached to the substrate 1 without applying the adhesive 2 to the substrate 1.

In the laminate 10 manufactured in this manner, since the substrate 1 is temporarily fixed to the support 4, it is possible to suitably execute desired processing such as wafer thinning and a back wiring process. As shown in (4) to (6) of FIG. 1 and (1) to (3) of FIG. 2, after the desired processing is performed, the release layer 3 is irradiated with light (laser) through the support 4, and thus it is possible to easily release the support 4 from the substrate 1 and to retrieve the substrate 1.

Hereinafter, the above-described processes will be described in detail. First, the formation of the release layer 3, which is a characteristic portion of this embodiment, will be described.

[Formation of Release Layer]

Figure 3:
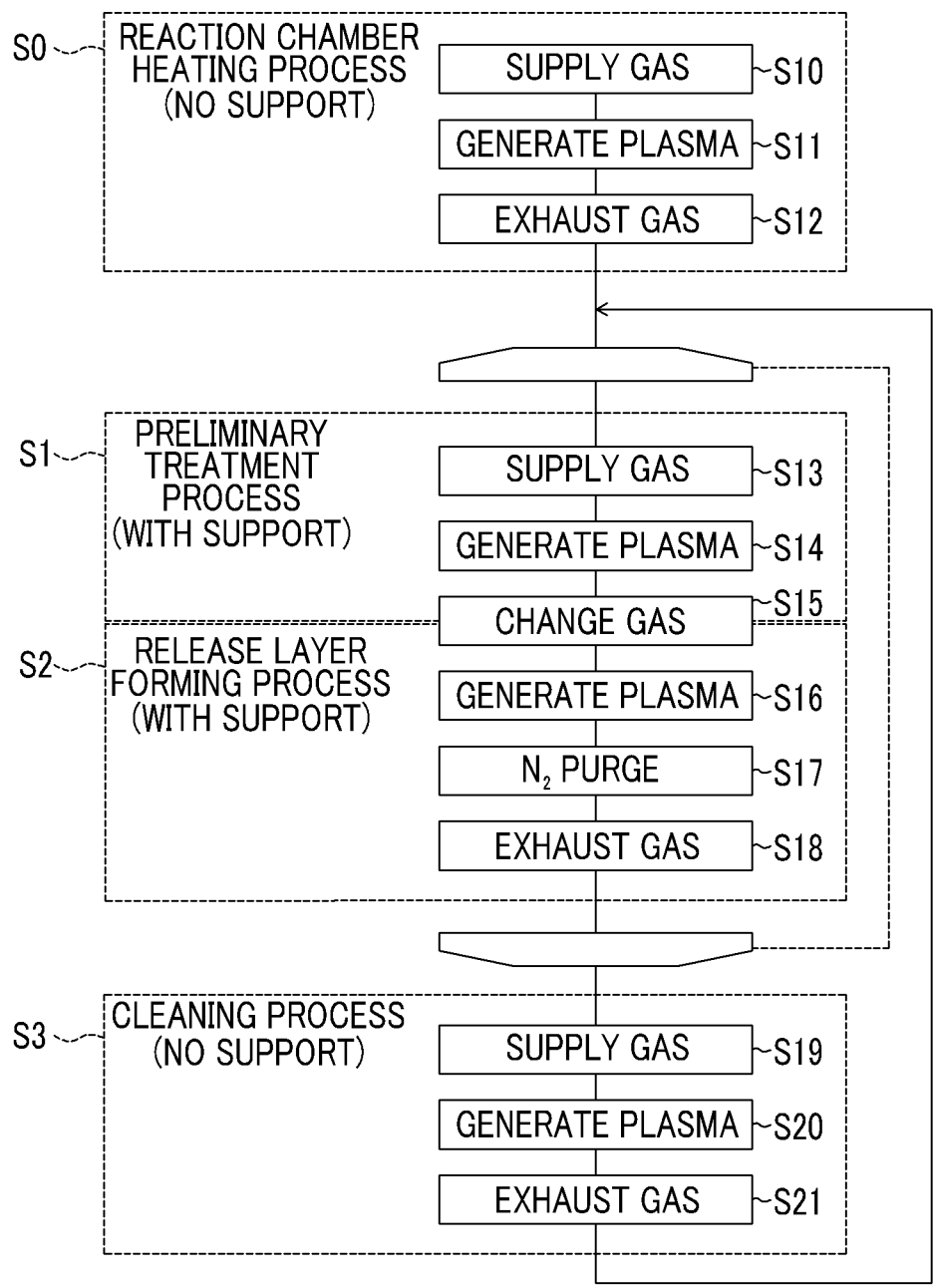
FIG. 3 is a flow chart illustrating an outline of a flow of the formation of a release layer according to an embodiment of the present invention.

In this embodiment, as shown in (2) of FIG. 1, the release layer 3 is formed on the support 4 by a plasma CVD method. FIG. 3 is a diagram illustrating an outline of a process of the formation of the release layer according to this embodiment. As shown in FIG. 3, the formation of the release layer in this embodiment roughly includes a reaction chamber heating process (step S0), a preliminary treatment process (step S1), a release layer forming process (step S2), and a cleaning process (step S3).

(Support)

First, the support 4 will be described. The support 4 has light transmittance. As will be described later, this is for the purpose of causing light beams 8 to pass through the support 4 and reach the release layer 3 when the irradiation with the light beams 8 is performed from the outside of the laminate 10 at the time of releasing the support 4 from the substrate 1. Accordingly, the support 4 does not necessarily transmit all the light beams and may be able to transmit light beams to be absorbed into the release layer 3 (having a desired wavelength). As the light beam to be absorbed into the release layer 3, a light beam having a wavelength of equal to or less than 2 µm, though not limited thereto, for example, a laser beam such as a solid laser such as a YAG laser, a ruby laser, a glass laser, a $YVO_4$ laser, an LD laser, and a fiber laser, a liquid laser such as a dye laser, a gas laser such as a $CO_2$ laser, an excimer laser, an Ar laser, and a He—Ne laser, a semiconductor laser and a free electron laser, or a non-laser beam may be appropriately used. As the light beam to be absorbed into the release layer 3, a light beam having a wavelength of, for example, equal to or less than 600 nm, though not limited thereto, may be used. In another respect, it is preferable that a light beam having light absorptivity of, for example, equal to or higher than 80% in the release layer 3 be used.

In addition, the support 4 is a component that supports the substrate 1. Accordingly, the support 4 may have strength necessary to prevent the substrate 1 from being damaged or deformed when the substrate 1 is processed and transported.

A material of the support 4 includes glass, silicon, and the like, but any component capable of accomplishing the above-described object can be adopted as the support 4.

(Release Layer)

In addition, the release layer 3 is configured to be transformed by absorbing light. The "transformation" of the release layer 3 in this specification means a phenomenon in which the release layer 3 is set to be in a breakable state under a slight external force or to be in a state where adhesion with a component (for example, the support 4) which comes into contact with the release layer 3 is decreased. As will be described later, when the support 4 is released from the substrate 1, the release layer 3 is transformed under the irradiation with light, and thus the strength or an adhesive property before the irradiation with light are lost. Accordingly, the release layer 3 is broken by applying a slight external force (for example, by raising the support 4), and thus it is possible to easily release the support 4 from the substrate 1.

(Plasma Treatment Apparatus)

In addition, a plasma treatment apparatus used in a plasma CVD method is not particularly limited, and a well-known plasma treatment apparatus can be used.

A coil electrode included in the plasma treatment apparatus is not particularly limited, and may be, for example, a dual coil antenna or a single coil antenna. It is possible to further improve the uniformity of the release layer 3 formed by this method by using a dual coil antenna.

The shape of a reaction chamber of the plasma treatment apparatus is not particularly limited, and may be a dome shape or any of other shapes such as a cylindrical shape. The size of the reaction chamber may be appropriately selected depending on the size of the substrate 1 to be processed. In addition, a well-known material that does not interfere with a plasma treatment and the formation of the release layer 3 can be appropriately selected as a material of the reaction chamber.

A plasma generated in the plasma treatment apparatus includes a conductive coupled plasma (CCP) based on an electrostatic field of a high-frequency voltage applied to a coil electrode and an inductive coupled plasma (ICP) based on an induction field which is generated by a high-frequency current flowing through a coil electrode.

A capacitive coupling-based plasma (E-mode plasma) is generally generated in a case of a low plasma density, and an inductive coupling-based plasma (H-mode plasma) is generally generated in a case of a high plasma density. Transition from the E-mode to the H-mode depends on a dielectric field, and switching from capacitive coupling to inductive coupling is performed when the dielectric field is set to be equal to or greater than a certain value. This phenomenon is generally referred to as a "mode jump" or "density jump". That is, a plasma generated with a power equal to or smaller than a power for starting a mode jump is the E-mode plasma, and a plasma generated with a power greater than a power for starting a mode jump is the H-mode plasma (for example, refer to Japanese Patent No. 3852655 and Japanese Patent No. 4272654).

In a preferred embodiment, the H-mode plasma may be a high-density plasma. Here, the high-density plasma refers to a plasma having an ion density of equal to or greater than $1 \times 10^{10}$ cm$^{-3}$.

Meanwhile, it is possible to easily determine whether the mode jump is started, from the appearance of the plasma treatment apparatus, in addition to by measuring the ion density of the plasma. For example, a powerful light emission is observed around the coil electrode after the mode jump is started.

In this embodiment, it is preferable that a high-frequency power to be applied to the coil electrode be set to be larger than a power for starting the mode jump. Thus, it is possible to improve a film formation speed of the release layer 3, the hardness of the release layer 3, and a light blocking effect of the release layer 3.

Meanwhile, a high-frequency power for starting the mode jump changes depending on the size and shape of the plasma treatment apparatus, the type and pressure of a reaction gas, and the like. For this reason, it is preferable that a high-frequency power for starting the mode jump be measured in advance. For example, it is possible to successfully obtain a high-frequency power for starting the mode jump by observing the appearance of the plasma treatment apparatus while changing the high-frequency power or by measuring an ion density inside the reaction chamber.

(Reaction Chamber Heating Process)

It is preferable that a reaction chamber heating process of increasing the temperature of a side wall of the reaction chamber be executed before the support 4 is carried into the reaction chamber of the plasma treatment apparatus and is processed. As shown in FIG. 3, in an embodiment, it is possible to perform the reaction chamber heating process (step S0) by supplying an inert gas such as $N_2$ into the reaction chamber (step S10), generating a plasma within the reaction chamber (step S11), and then exhausting a gas (step S12).

Step S11 is preferably executed so that the side wall of the reaction chamber reaches a desired temperature, is more preferably executed so that the temperature of the side wall of the reaction chamber is set to 80° C. or higher, and is further preferably executed so that the temperature of the side wall of the reaction chamber is set to 180° C. or higher.

It is possible to suppress the attachment of a recombined source gas to the side wall by performing the reaction chamber heating process. In particular, it is possible to improve the film formation speed by increasing the temperature of the side wall of the reaction chamber to 80° C. or higher.

(Preliminary Treatment Process)

It is preferable that a preliminary treatment process of increasing temperatures of the support 4 and the inside of the reaction chamber be executed before executing a plasma CVD method after the support 4 is carried into the reaction chamber. The preliminary treatment process is not particularly limited as long as the process includes performing a plasma treatment within the reaction chamber to thereby increase temperatures of the support 4 and the inside of the reaction chamber. For example, in an embodiment, as shown in FIG. 3, it is possible to perform the preliminary treatment process (step S1) by supplying a preliminary processing gas to be used in the preliminary treatment process into the reaction chamber (step S13), generating a plasma within the reaction chamber (step S14), and then changing a gas to be supplied into the reaction chamber to a gas to be used in a release layer forming process to be described later (step S15). In addition, it is also possible to increase the temperature of the support 4 by heating a stage on which the support 4 is placed within the reaction chamber.

By the preliminary treatment process being performed, it is possible to cause the temperature of the support to approach a target temperature (for example, 240° C.) during the execution of a plasma CVD method before executing the plasma CVD method. Accordingly, when the plasma CVD method is executed, the maintenance of the temperature of the support in the vicinity of the target temperature is facilitated. As a result, it is possible to maintain a constant state within the processing chamber during the execution of the plasma CVD method, thereby allowing discharge to be uniformly performed. Thus, it is possible to mass-produce a satisfactory release layer.

In the preliminary treatment process according to an embodiment, the temperature of the inside of the reaction chamber is preferably increased to 120° C. or higher, and is more preferably increased to 200° C. or higher. The temperature of the inside of the reaction chamber being increased to 120° C. or higher facilitates the maintenance of the temperature of the inside of the reaction chamber in the vicinity of the target temperature during the execution of the plasma CVD method.

Further, in the preliminary treatment process, the surface of the support 4 may be cleaned. In an embodiment, it is possible to suitably clean the surface of the support 4 in the preliminary treatment process by including oxygen in the preliminary processing gas. Accordingly, attached substances on the surface of the support 4 are removed, and thus it is possible to more satisfactorily form the release layer.

It is preferable that the preliminary processing gas include oxygen as described above. In addition, the preliminary processing gas may further include one or more gases selected from the group consisting of $H_2$, $N_2$, fluorinated hydrocarbons, and an inert gas. The fluorinated hydrocarbon may be suitably $CF_4$, $CHF_3$, $CH_2F_2$, or the like. It is possible to improve the adhesiveness of the release layer 3 with respect to the support 4, particularly, the glass support 4 by including $H_2$, $H_2N_2$, or a fluorinated hydrocarbon in the preliminary processing gas.

A flow rate of the preliminary processing gas may be appropriately set depending on the size of the reaction chamber and is not particularly limited. In addition, pressure inside the reaction chamber in the preliminary treatment process is not particularly limited, but can be set to, for example, equal to or higher than 50 Pa and equal to or lower than 200 Pa. In addition, a plasma generation time may be appropriately set depending on the sizes of the reaction chamber and the support 4 so that the temperature of the inside of the reaction chamber can be increased to the above-described temperature.

(Release Layer Forming Process)

After the preliminary treatment process, a release layer forming process of forming the release layer 3 on the support 4 by a plasma CVD method is preferably executed. The release layer forming process is not particularly limited as long as the process includes supplying a source gas serving as the release layer 3 into the reaction chamber to thereby form the release layer 3 on the support 4 by the plasma CVD method. For example, in an embodiment, as shown in FIG. 3, it is possible to perform the release layer forming process (step S2) by changing a gas to be supplied into the reaction chamber to a gas containing a source gas (step S15), forming the release layer 3 on the support 4 by a plasma CVD method (step S16), performing an $N_2$ purge in order to remove dirt inside the reaction chamber (step S17), and finally exhausting the gas (step S18).

It is possible to use a gas containing at least one of a fluorocarbon gas and a hydrocarbon gas as the source gas. A plasma CVD method is executed by using at least one of the fluorocarbon gas and the hydrocarbon gas as the source gas, and thus it is possible to suitably form the release layer 3.

Examples of the fluorocarbon gas include $C_xF_y$ and $C_xH_yF_z$ (x, y, and z are natural numbers) and more specifically include $CHF_3$, $CH_2F_2$, $C_2H_2F_2$, $C_4F_8$, $C_2F_6$, $C_5F_8$, and the like, but are not limited thereto. In addition, examples of the hydrocarbon gas include alkanes such as $CH_4$, alkenes such as ethylene, and alkynes such as acetylene.

In addition, one or more of an inert gas such as nitrogen, helium, or argon, a hydrocarbon gas such as an alkane, an alkene, or an alkyne, a fluorocarbon gas, or an additive gas such as hydrogen or oxygen may be added to the source gas. The amount of additive gas to be added is not particularly limited. For example, when hydrogen is added, the hydrogen is preferably added at a proportion of equal to or higher than 5% and equal to or lower than 20% with respect to the total gas, but is not limited thereto. In addition, it is preferable that oxygen be added in a very small amount or be not added, but there is no limitation thereto.

Meanwhile, the source gas may include a fluorocarbon gas as its main component. In this case, a hydrocarbon gas may be contained as an additive gas. The amount of additive gas with respect to the total source gas is preferably, for example, equal to or higher than 5% and equal to or lower than 20%. In contrast, when the source gas contains a hydrocarbon gas as its main component, a fluorocarbon gas is preferably contained as an additive gas. Meanwhile, a main component means a gas which is contained in the largest amount (volume %) in gases to be supplied into the reaction chamber. In addition, the source gas is suitably stirred by adding an appropriate amount of inert gas, and thus it is possible to uniformly form the release layer 3.

A flow rate of the source gas and the pressure inside the reaction chamber are not particularly limited, but may be set to various conditions.

The target temperature inside the reaction chamber during the execution of a plasma CVD method is not particularly limited, and a well-known temperature can be used. The target temperature is more preferably set to be in a range of 100° C. or higher to 300° C. or lower, and is particularly preferably set to be in a range of 200° C. or higher to 250° C. or lower. The temperature inside the reaction chamber is set to be in such a range, and thus it is possible to suitably execute the plasma CVD method.

The thickness of the release layer 3 is not particularly limited, and the release layer may have a film thickness capable of sufficiently absorbing light to be used. For example, the film thickness is preferably set to be 0.05 μm to 100 μm and is particularly preferably set to be 0.1 μm to 5 μm.

A formation time of the release layer 3 in the release layer forming process may be set depending on a film thickness to be formed.

Step S17 is an $N_2$ purge for removing dirt inside the reaction chamber and is performed by supplying $N_2$ into the reaction chamber, but this process may be omitted. In addition, a purge using any of other inert gases may be performed.

In addition, after step S18 is completed, it is possible to mass-produce the support 4 with the release layer 3 by extracting the support 4 having the release layer 3 formed thereon from the reaction chamber, carrying a new support 4 into the reaction chamber, and repeating step S13 to step S18 a predetermined number of times.

(Cleaning Process)

After the preliminary treatment process and the release layer forming process are repeated a predetermined number of times, a cleaning process of cleaning the inside of the reaction chamber by a plasma treatment is preferably executed. For example, in an embodiment, as shown in FIG. 3, it is possible to perform the cleaning process (step S3) by supplying a cleaning gas to be used in a cleaning process to the reaction chamber (step S19), generating a plasma within the reaction chamber (step S20), and then exhausting the gas (step S21).

The reaction chamber which gets dirty due to the execution of the plasma CVD method is cleaned by performing the cleaning process, and thus it is possible to maintain a constant state inside the reaction chamber. Accordingly, it is possible to form a satisfactory release layer 3 by using the same plasma treatment apparatus again, and thus it is possible to contribute to the mass production of the laminate 10.

It is preferable that a cleaning gas contain oxygen. It is possible to suitably clean the dirt inside the reaction chamber in step S20 by the cleaning gas containing oxygen. The cleaning gas may further contain one or more gases selected from the group consisting of $H_2$, $N_2$, a fluorinated hydrocarbon, and an inert gas. The fluorinated hydrocarbon may be suitably $CF_4$, $CHF_3$, $CH_2F_2$, or the like. It is possible to suitably remove dirt (for example, fluorides), which cannot be sufficiently removed using only oxygen, by including $H_2$, $H_2N_2$, or a fluorinated hydrocarbon in the cleaning gas.

A flow rate of the cleaning gas and a plasma generation time may be appropriately set depending on the size of the reaction chamber, and are not particularly limited. In addition, pressure inside the reaction chamber in the cleaning process is not particularly limited, but can be set to, for example, equal to or higher than 50 Pa and equal to or lower than 200 Pa.

After the cleaning process is completed, it is possible to suitably mass-produce the support 4 with the release layer 3 by repeating the preliminary treatment process and the release layer forming process again.

Next, the attachment of the support 4 with the release layer 3, which is manufactured in the above-described manner, to the substrate 1 will be described.

[Attachment of Support with Release Layer to Substrate]

As shown in (1) of FIG. 1, the adhesive 2 is applied to the side of the substrate 1 which is supported by the support 4. The substrate 1 is not particularly limited, but may be, for example, a semiconductor wafer. In other words, the side of the substrate 1 which is supported by the support 4 refers to the opposite side to a side on which processing (for example, thinning and back wiring) for the laminate 10 is performed, and may be, for example, an element formation surface of the substrate 1 on which a desired element is formed.

The adhesive 2 attaches and fixes the substrate 1 to the support 4 and covers and protects the surface of the substrate 1. Accordingly, a layer formed by the adhesive 2 has an adhesive property and strength for maintaining the fixation of the substrate 1 to the support 4 and the covering of the surface of the substrate 1 to be protected during the processing and transportation of the substrate 1. On the other hand, when the fixation of the substrate 1 to the support 4 is made unnecessary, high releasability and removability from the substrate 1 are required.

Therefore, it is preferable that the adhesive 2 be an adhesive which usually has a strong adhesive property and has an adhesive property deteriorating due to any process or which has solubility with respect to a specific solvent. Various adhesives which are well known in the art, for example, acryl-based, novolac-based, naphthoquinone-based, hydrocarbon-based, and polyimide-based adhesives can be used as the adhesive 2.

Meanwhile, it is preferable that a resin other than a photocurable resin (for example, a UV curable resin) be used as the adhesive 2. This is because the photocurable resin may remain as residues in the vicinity of minute irregularities of a substrate to be supported, after the adhesive 2 is released or removed. In particular, an adhesive soluble in a specific solvent is preferably used. This is because the adhesive 2 can be removed by being dissolved with the solvent without applying a physical force to the substrate 1. When the adhesive 2 is removed, it is possible to easily remove the adhesive 2 even from the substrate 1 having a reduced strength, without damaging or deforming the substrate 1.

In an embodiment, after the adhesive 2 is applied to the substrate 1, baking is performed in stages while increasing the temperature to solidify the adhesive 2, and thus it is possible to form a layer.

In another embodiment, a film having the adhesive 2 applied to both sides thereof in advance (so-called double-sided tape) may be attached to the substrate 1, instead of directly applying the adhesive 2 to the substrate 1.

The release layer 3 formed on the support 4 is attached to the substrate 1 having the adhesive 2 applied thereto, thereby completing the manufacture of the laminate 10 in which the substrate 1, the layer constituted by the adhesive 2, the release layer 3, and the support 4 are laminated in this order. Meanwhile, other layers may be interposed between the layers.

A well-known method may be used as a method of attaching the layers to each other. For example, a method can be adopted of bonding layers to each other by pressurization under high temperature of approximately 200° C. to 300° C. in a vacuum.

Meanwhile, in this embodiment, a description is made of a method of applying the adhesive 2 onto the substrate 1 and then performing bonding to the support 4 having the release layer 3 formed thereon, but the present invention is not limited thereto. For example, the release layer 3 may be formed on the support 4, the adhesive 2 may be applied onto the release layer 3, and then the substrate 1 may be bonded thereto.

In addition, the release layer 3 may also function as the adhesive 2. That is, the laminate 10 may be manufactured by forming the release layer 3 on the support 4 and then directly bonding the release layer 3 to the substrate 1.

According to the laminate 10 manufactured in the above-described manner, the substrate 1 is temporarily fixed to the support 4, and thus it is possible to suitably execute desired processes such as wafer thinning and a back wiring process. As described below, the support 4 is released from the substrate 1, and thus it is possible to successfully retrieve the substrate 1 subjected to the desired processes.

[Release of Support from Substrate]

As shown in (4) of FIG. 1 and (1) and (2) of FIG. 2, first, the release layer 3 is irradiated with the light beams 8 from the support 4 side, and thus is transformed. As the light beam 8 with which the release layer 3 is irradiated, for example, a laser beam such as a solid laser such as a YAG laser, a ruby laser, a glass laser, a YVO$_4$ laser, an LD laser, and a fiber laser, a liquid laser such as a dye laser, a gas laser such as a CO$_2$ laser, an excimer laser, an Ar laser, and a He—Ne laser, a semiconductor laser and a free electron laser, or a non-laser beam may be appropriately used depending on a wavelength absorbable into the release layer 3. Although the wavelength of the light beam to be absorbed into the release layer 3 is not limited to that described below, a light beam having a wavelength of, for example, equal to or less than 600 nm may be used. In another respect, a light beam having light absorptivity of, for example, equal to or higher than 80% in the release layer 3 is preferably used.

Meanwhile, the irradiation with the light beams 8 may be performed from a direction perpendicular to the surface of the release layer 3 as shown in (1) of FIG. 2, or may be performed obliquely. In addition, the irradiation with the light beams 8 may be simultaneously performed substantially on the entire surface of the release layer 3, or may be performed so as to scan in-plane with respect to the release layer 3.

Meanwhile, the irradiation with the light beams 8 from the support 4 side is for the purpose of avoiding the influence of the light beams 8 on the structure of the substrate 1. The light beams 8 are absorbed into the release layer 3 by the irradiation with the light beams 8 from the support 4 side, and thus it is possible to avoid the light beams 8 from reaching the substrate 1.

As described above, the release layer 3 is configured to be transformed by the irradiation with light. For this reason, when the irradiation with light is completed, the release layer 3 is transformed into a release layer 3' as shown in (2) of FIG. 2.

Subsequently, the support 4 is released from the substrate 1. The strength of the release layer 3' transformed by the irradiation with light is considerably reduced. Therefore, for example, the support 4 is raised by applying a slight external force, and thus the release layer 3' is easily broken, thereby allowing the support 4 to be released from the substrate 1.

Meanwhile, in (3) of FIG. 2, the release is drawn to occur in an interface between the support 4 and the release layer 3, but the location of the release is not limited thereto. The release may occur in an interface between the release layer 3 and the adhesive 2.

Thereafter, it is preferable that the adhesive 2 remaining on the substrate 1 from which the support 4 is released be removed. For example, the adhesive 2 can be removed by spraying a solvent for dissolving the adhesive 2 onto the adhesive 2. Thus, it is possible to obtain the substrate 1 from which the adhesive 2 is removed.

Here, after the support 4 is released, the residues of the release layer 3' may be attached onto the substrate 1. When just a small amount of release layer 3' is attached, the release layer 3' can be removed together with the adhesive 2 by spraying a solvent for dissolving the adhesive 2 as described above. In addition, a solvent for dissolving the release layer 3' may be first sprayed, and then the solvent for dissolving the adhesive 2 may be sprayed.

Modification Example

Meanwhile, in the release layer forming process, the release layer 3 may be formed by an atomic layer deposition (ALD) method instead of a plasma CVD method. For example, a thermal ALD method, a plasma-enhanced atomic layer deposition (PEALD) method, and the like can be used as the ALD method. It is possible to avoid problems such as running costs and effluent also by the ALD method, similar to a plasma CVD method.

In addition, it is also possible to use a capacitively coupled plasma in conjunction with an inductively coupled plasma as another embodiment.

The present invention has been specifically described on the basis of the embodiment. However, the present invention is not limited to the above-described embodiment, and various modifications can be made within the scope of claims. An embodiment derived from a proper combination of technical means disclosed in different embodiments is encompassed in the technical scope of the present invention.

The present invention will be described in more detail by the following Example, but is not limited thereto.

EXAMPLE

Formation of Release Layer

As Example, the processes shown in FIG. 3 were performed to form a release layer on a 12-inch glass substrate. As a plasma treatment apparatus, a plasma treatment apparatus for a 12-inch substrate was used which included a dual coil antenna (1.8 μH to 2.0 μH) and a high-frequency generator (13.56 MHz) which were connected to each other through a capacitor (20 pF) and a matching circuit.

First, the reaction chamber heating process (step S0) was executed. In detail, $N_2$ was supplied into a reaction chamber in step S10. Thereafter, in step S11, a plasma was generated so that the temperature of a side wall of the reaction chamber was set to approximately 180° C. while supplying $N_2$ into the reaction chamber. A power for generating the plasma was set to 2.8 kW. In addition, the pressure inside the reaction chamber was set to 160 Pa, and a flow rate of $N_2$ was set to 5.0 L/min. Thereafter, in step S12, the gas inside the reaction chamber was exhausted. Through the steps described above, the reaction chamber heating process was completed, and a glass substrate was carried into the reaction chamber.

Subsequently, a set of the preliminary treatment process (step S1) and the release layer forming process (step S2) were repeatedly performed. In detail, $O_2$ and $H_2+N_2$ were supplied into the reaction chamber in step S13. Thereafter, in step S14, a plasma was generated for 25 seconds while supplying $O_2$ and $H_2+N_2$ into the reaction chamber. A power for generating the plasma was set to 2.8 kW. In addition, the pressure inside the reaction chamber was set to 133 Pa, and flow rates of $O_2$ and $H_2+N_2$ were set to 3.8 L/min and 0.2 L/min, respectively.

Thereafter, in step S15, $C_4F_8$ was supplied into the reaction chamber. Subsequently, in step S16, a plasma CVD method was executed for four to five minutes while supplying $C_4F_8$ into the reaction chamber. A power for generating a plasma was set to 2.8 kW. In addition, pressure inside the reaction chamber was set to 70 Pa, and a flow rate of $C_4F_8$ was set to 0.4 L/min. Thereafter, in step S17, $N_2$ was supplied into the reaction chamber. In step S18, the gas inside the reaction chamber was exhausted. At this time, the pressure inside the reaction chamber was set to 13 Pa. Thirteen sets of step S13 to step S18 described above were repeated while changing the support 4 carried into the reaction chamber.

Next, in a state where the support 4 was not carried into the reaction chamber, the cleaning process (step S3) was executed. In detail, $O_2$ and $H_2+N_2$ were supplied into the reaction chamber in step S19. Thereafter, in step S20, a plasma was generated for five minutes while supplying $O_2$ and $H_2+N_2$ into the reaction chamber. A power for generating the plasma was set to 2.8 kW. In addition, pressure inside the reaction chamber was set to 133 Pa, and flow rates of $O_2$ and $H_2+N_2$ were set to 3.8 L/min and 0.2 L/min, respectively. In step S21, the gas inside the reaction chamber was exhausted. At this time, the pressure inside the reaction chamber was set to 13 Pa. Thereafter, the method returned to step S13, and a set of the preliminary treatment process and the release layer forming process were repeated again.

FIG. 4 is a graph showing emission intensity of a plasma in processes at the time of forming a release layer. As shown in FIG. 4, it was possible to obtain uniform discharge during the execution of the release layer forming process for each time (during the execution of a plasma CVD method). Therefore, it could be understood that, according to the present invention, a uniform release layer can be mass-produced successfully.

(Evaluation of Releasability of Laminate)

A semiconductor wafer was used as the substrate 1. The hydrocarbon-based adhesive 2 was applied onto the substrate 1, and then baking was performed thereon. In this manner, the substrate 1 having the adhesive 2 applied thereto and each of the release layers 3 formed under the above-described conditions were caused to face each other and to be bonded to each other, thereby creating the laminate 10 corresponding to the above-described conditions.

After the substrate 1 of the created laminate 10 was thinned, the release layer 3 was irradiated with a green laser having a wavelength of 532 nm from the support 4 side of each laminate 10. Specifically, the laminate 10 was irradiated with a laser of 532 nm having an irradiation pitch of 160 μm, an average power of 1.8 W, and a feed rate of 6000 mm/sec. The number of times of laser scanning was set to once.

As a result, any of the release layers 3 in the laminates 10 corresponding to the above-described conditions were transformed under the irradiation with a laser. Thus, the support 4 was easily released from the substrate 1 only by simply raising the support 4. In addition, when the released support 4 and the surface of the substrate 1 were observed with the naked eye, there was no residue except that a slight amount of black powder, which is a resultant of the transformation of the release layer 3, was seen on the substrate 1.

INDUSTRIAL APPLICABILITY

A method of manufacturing a laminate according to the present invention can be used in, for example, a substrate processing field.

REFERENCE SIGNS LIST

1: Substrate
2: Adhesive
3: Release layer
4: Support
8: Light beam
10: laminate

What is claimed is:
1. A method of manufacturing a laminate which includes a substrate, a light-transmitting support that supports the substrate, and a release layer which is provided between the substrate and the support and is configured to be transformed by absorbing light with which irradiation is performed through the support, the method comprising:
   a preliminary treatment process of increasing temperatures of the support carried into a reaction chamber and the inside of the reaction chamber by a plasma treatment; and a release layer forming process of supplying a source gas serving as the release layer into the reaction chamber after the preliminary treatment process to form the release layer on the support.

2. The method of manufacturing a laminate according to claim 1, wherein:
- a preliminary processing gas including oxygen is supplied into the reaction chamber in the preliminary treatment process;
- the preliminary processing gas further includes one or more gases selected from a group consisting of hydrogen, nitrogen, a fluorinated hydrocarbon, and an inert gas; and
- the temperature inside the reaction chamber is increased to 120° C. or higher in the preliminary treatment process.

3. The method of manufacturing a laminate according to claim 2, further comprising a cleaning process of cleaning the inside of the reaction chamber by a plasma treatment, after the release layer forming process, wherein:
- a cleaning gas including oxygen is supplied into the reaction chamber in the cleaning process; and
- the cleaning gas further includes one or more gases selected from a group consisting of hydrogen, nitrogen, a fluorinated hydrocarbon, and an inert gas.

4. The method of manufacturing a laminate according to claim 3, wherein:
- the source gas includes at least one of a hydrocarbon and a fluorinated hydrocarbon; and
- a plasma CVD method is executed using a high-frequency power which is set to be larger than a power for starting a mode jump, in the release layer forming process.

5. The method of manufacturing a laminate according to claim 4, further comprising a reaction chamber heating process of increasing a temperature of a side wall inside the reaction chamber by a plasma treatment, before the preliminary treatment process, wherein the temperature of the side wall is increased to 80° C. or higher in the reaction chamber heating process.

6. The method of manufacturing a laminate according to claim 5, further comprising attachment of the support with the release layer to the substrate.

7. The method of manufacturing a laminate according to claim 1, further comprising a cleaning process of cleaning the inside of the reaction chamber by a plasma treatment, after the release layer forming process.

8. The method of manufacturing a laminate according to claim 7, wherein a cleaning gas including oxygen is supplied into the reaction chamber in the cleaning process.

9. The method of manufacturing a laminate according to claim 8, wherein the cleaning gas further includes one or more gases selected from a group consisting of hydrogen, nitrogen, a fluorinated hydrocarbon, and an inert gas.

10. The method of manufacturing a laminate according to claim 1, wherein a preliminary processing gas including oxygen is supplied into the reaction chamber in the preliminary treatment process.

11. The method of manufacturing a laminate according to claim 10, wherein the preliminary processing gas further includes one or more gases selected from a group consisting of hydrogen, nitrogen, a fluorinated hydrocarbon, and an inert gas.

12. The method of manufacturing a laminate according to claim 1, further comprising a reaction chamber heating process of increasing a temperature of a side wall inside the reaction chamber by a plasma treatment, before the preliminary treatment process.

13. The method of manufacturing a laminate according to claim 12, wherein the temperature of the side wall is increased to 80° C. or higher in the reaction chamber heating process.

14. The method of manufacturing a laminate according to claim 1, wherein the release layer is formed by a plasma CVD method or a plasma ALD method in the release layer forming process.

15. The method of manufacturing a laminate according to claim 1, wherein the temperature inside the reaction chamber is increased to 120° C. or higher in the preliminary treatment process.

16. The method of manufacturing a laminate according to claim 1, wherein the source gas includes at least one of a hydrocarbon and a fluorinated hydrocarbon.

17. The method of manufacturing a laminate according to claim 1, wherein a plasma CVD method is executed using a high-frequency power which is set to be larger than a power for starting a mode jump, in the release layer forming process.

18. The method of manufacturing a laminate according to claim 1, further comprising attachment of the support with the release layer to the substrate.

* * * * *